(12) United States Patent
Wachter et al.

(10) Patent No.: US 9,275,878 B2
(45) Date of Patent: Mar. 1, 2016

(54) METAL REDISTRIBUTION LAYER FOR MOLDED SUBSTRATES

(71) Applicant: Infineon Technologies AG, Neubiberg (DE)

(72) Inventors: Ulrich Wachter, Regensburg (DE); Dominic Maier, Pleystein (DE); Thomas Kilger, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/043,138

(22) Filed: Oct. 1, 2013

(65) Prior Publication Data

US 2015/0091171 A1    Apr. 2, 2015

(51) Int. Cl.
| | |
|---|---|
| H01L 23/48 | (2006.01) |
| H01L 21/56 | (2006.01) |
| H01L 21/768 | (2006.01) |
| H01L 23/31 | (2006.01) |
| H01L 23/00 | (2006.01) |

(52) U.S. Cl.
CPC ........ *H01L 21/561* (2013.01); *H01L 21/76838* (2013.01); *H01L 23/31* (2013.01); *H01L 23/48* (2013.01); *H01L 24/19* (2013.01); *H01L 24/96* (2013.01); *H01L 21/568* (2013.01); *H01L 2224/04105* (2013.01); *H01L 2224/12105* (2013.01); *H01L 2924/181* (2013.01); *H01L 2924/19107* (2013.01)

(58) Field of Classification Search
USPC ................. 257/678, 772, 741, 787, E23.001, 257/E23.023
See application file for complete search history.

(56) References Cited

U.S. PATENT DOCUMENTS

| | | | |
|---|---|---|---|
| 5,353,498 | A | 10/1994 | Fillion et al. |
| 6,002,592 | A | 12/1999 | Nakamura et al. |
| 6,404,041 | B1 | 6/2002 | Gantioler et al. |
| 7,161,252 | B2 | 1/2007 | Tsuneoka et al. |

(Continued)

FOREIGN PATENT DOCUMENTS

| | | |
|---|---|---|
| DE | 19806817 C1 | 2/1998 |
| DE | 102004021054 A1 | 11/2005 |

(Continued)

OTHER PUBLICATIONS

Wachter, et al. "Molded Semiconductor Package with Backside Die Metallization ." U.S. Appl. No. 13/964,153, filed Aug. 12, 2013.

(Continued)

*Primary Examiner* — Timor Karimy
(74) *Attorney, Agent, or Firm* — Murphy, Bilak & Homiller, PLLC

(57) ABSTRACT

Integrated circuits are packaged by placing a plurality of semiconductor dies on a support substrate, each one of the semiconductor dies having a plurality of terminals at a side facing the support substrate and covering the semiconductor dies with a molding compound to form a molded structure. The support substrate is then removed from the molded structure to expose the side of the semiconductor dies with the terminals, and a metal redistribution layer is formed on the molded structure and in direct contact with the terminals of the semiconductor dies and the molding compound. The redistribution layer is formed without first forming a dielectric layer on a side of the molded structure with the terminals of the semiconductor dies. A corresponding molded substrate and individual molded semiconductor packages are also disclosed.

10 Claims, 6 Drawing Sheets

(56) References Cited

U.S. PATENT DOCUMENTS

| | | |
|---|---|---|
| 7,294,529 B2 | 11/2007 | Tuominen |
| 7,622,733 B2 | 11/2009 | Fuergut et al. |
| 7,915,089 B2 | 3/2011 | Fuergut et al. |
| 7,936,048 B2 | 5/2011 | Otremba |
| 7,943,423 B2 | 5/2011 | Pohl et al. |
| 8,039,315 B2 | 10/2011 | Lee et al. |
| 8,044,523 B2 | 10/2011 | Otremba |
| 8,263,439 B2 | 9/2012 | Marimuthu et al. |
| 8,288,201 B2 | 10/2012 | Pagaila et al. |
| 8,318,540 B2 | 11/2012 | Beer |
| 8,324,020 B2 * | 12/2012 | Eichelberger et al. ........ 438/106 |
| 8,324,718 B2 | 12/2012 | Honda |
| 8,372,695 B2 | 2/2013 | Park et al. |
| 8,378,466 B2 | 2/2013 | Chiu et al. |
| 8,390,107 B2 | 3/2013 | Meyer |
| 2009/0102002 A1 * | 4/2009 | Chia et al. .................... 257/433 |
| 2010/0078784 A1 | 4/2010 | Otremba |
| 2014/0097536 A1 * | 4/2014 | Schunk ......................... 257/738 |
| 2014/0264808 A1 * | 9/2014 | Wolter et al. ................. 257/678 |
| 2015/0028478 A1 * | 1/2015 | Meyer et al. ................. 257/738 |

FOREIGN PATENT DOCUMENTS

| | | |
|---|---|---|
| DE | 102004030042 A1 | 1/2006 |
| DE | 102006012739 B3 | 11/2007 |
| DE | 102009012524 A1 | 9/2009 |
| DE | 102006023123 B4 | 1/2011 |

OTHER PUBLICATIONS

Wachter, et al. "Method of Packaging Integrated Circuits and a Molded Substrate With Non-Functional Placeholders Embedded in a Molding Compound." U.S. Appl. No. 13/944,260, filed Jul. 17, 2013.

* cited by examiner

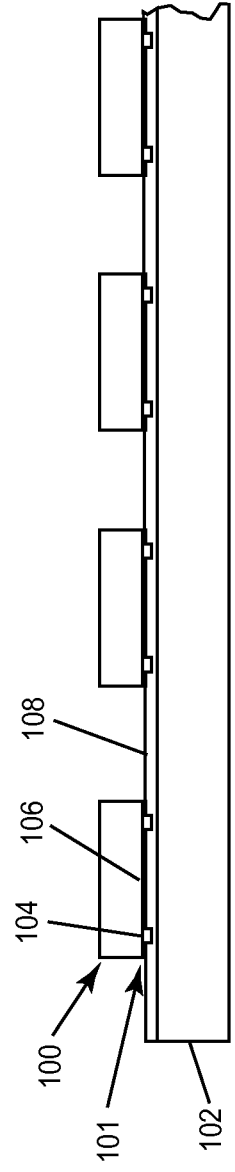
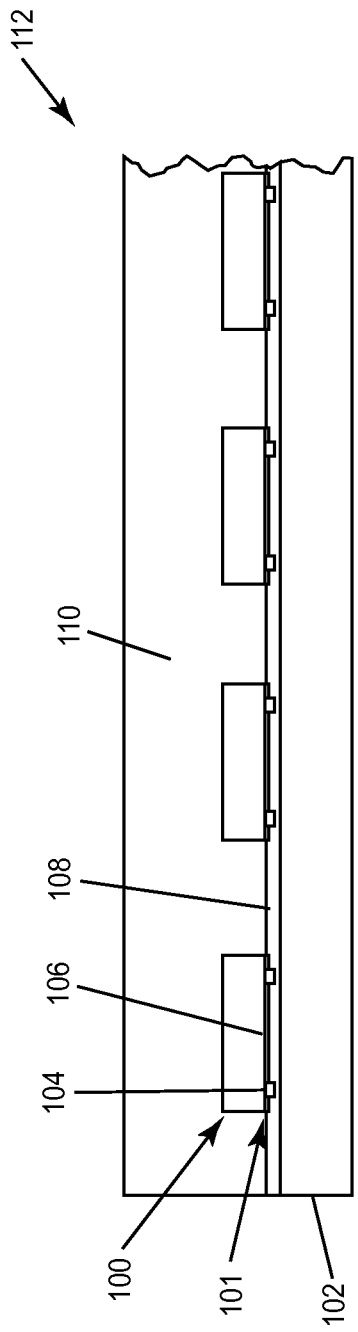

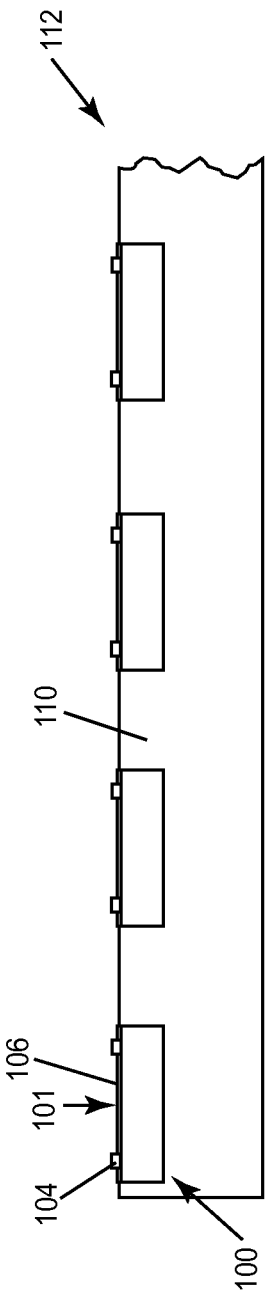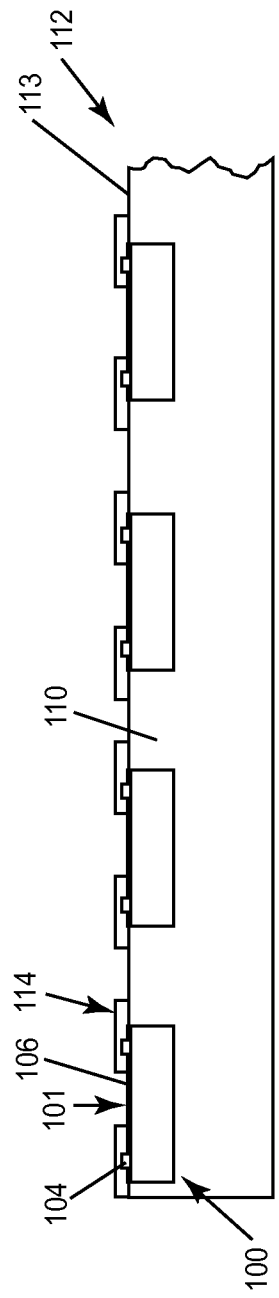

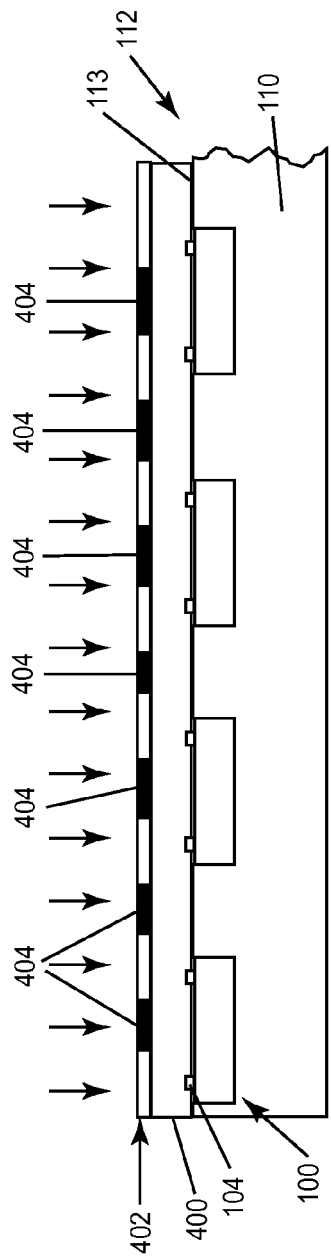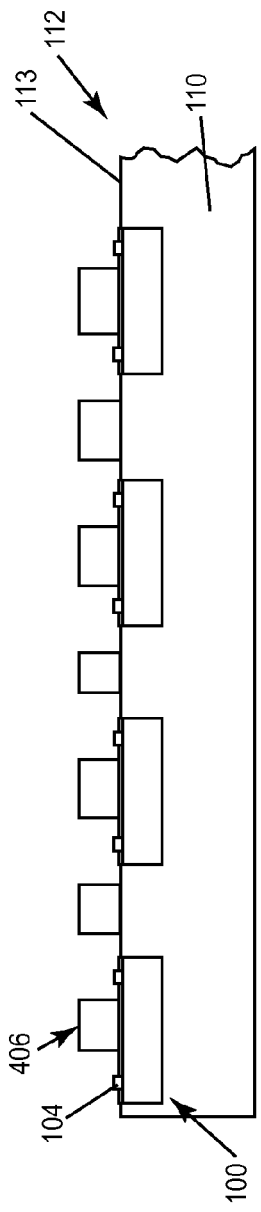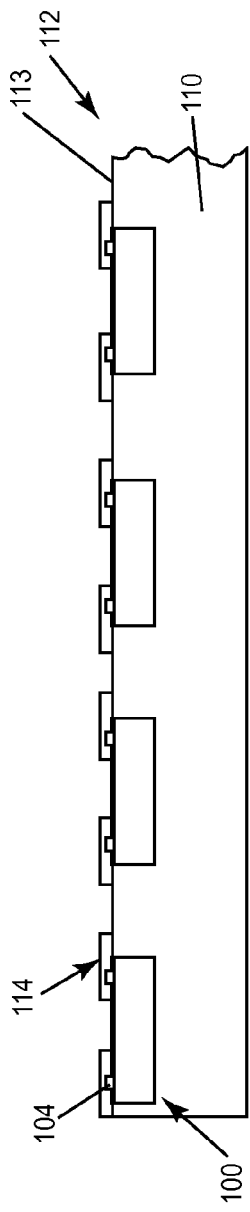

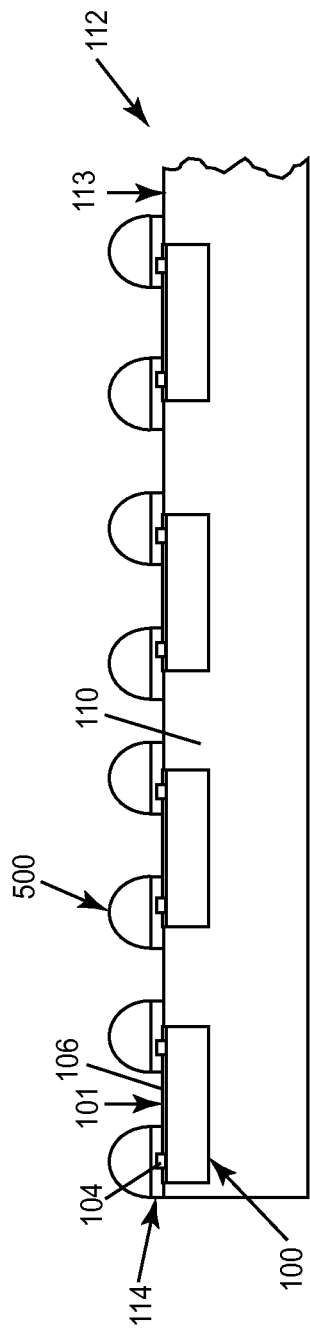
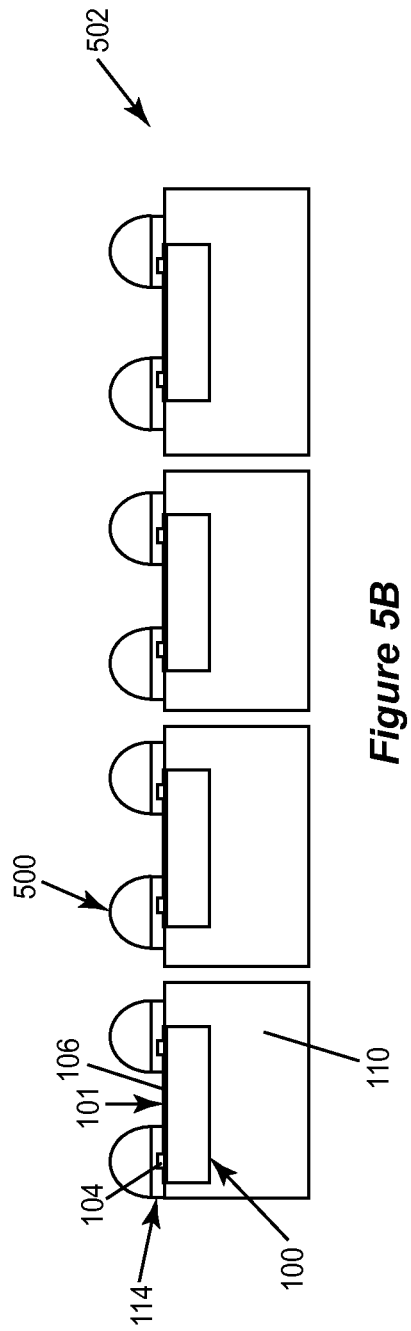
*Figure 5A*
*Figure 5B*

METAL REDISTRIBUTION LAYER FOR MOLDED SUBSTRATES

TECHNICAL FIELD

The present application relates to packaging of integrated circuits, in particular molded substrates for packaging integrated circuits.

BACKGROUND

Embedded wafer level ball grid array (eWLB) is a packaging technology for integrated circuits (ICs) where the package interconnects are applied on an artificial wafer made of individual semiconductor dies (chips) and a molding compound. The semiconductor dies are embedded (overmolded) by the molding compound. A redistribution layer is applied to a side of the eWLB wafer at which the pads of the dies are available. Electrical connections are formed between the die pads and the redistribution layer. Solder bumps are typically provided on the redistribution layer to enable package mounting after singulation or separation of the eWLB wafer into individual IC packages. With eWLB technology, the final package layout is defined and with parallel wafer processing the cost per package can be reduced. Further cost reductions are desired so that eWLB technology is more cost competitive with less expensive packaging technologies.

SUMMARY

According to an embodiment of a method of packaging integrated circuits, the method comprises: placing a plurality of semiconductor dies on a support substrate, each one of the semiconductor dies having a plurality of terminals at a side facing the support substrate; covering the semiconductor dies with a molding compound to form a molded structure; removing the support substrate from the molded structure to expose the side of the semiconductor dies with the terminals; and forming a metal redistribution layer on the molded structure and in direct contact with the terminals of the semiconductor dies and the molding compound, without first forming a dielectric layer on a side of the molded structure with the terminals of the semiconductor dies.

According to an embodiment of a molded substrate, the molded substrate comprises a molded structure comprising a plurality of semiconductor dies embedded in a molding compound. Each one of the semiconductor dies has a plurality of terminals at a side uncovered by the molding compound. The molded substrate further comprises a metal redistribution layer on the molded structure and in direct contact with the terminals of the semiconductor dies and the molding compound.

According to an embodiment of a molded semiconductor package, the molded semiconductor package comprises a semiconductor die embedded in a molding compound. The semiconductor die has a plurality of terminals at a side uncovered by the molding compound. The molded semiconductor package further comprises a metal redistribution layer in direct contact with the terminals of the semiconductor die and extending beyond a lateral edge of the semiconductor die onto the molding compound. The metal redistribution layer directly contacts the molding compound.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A through 1D illustrate respective cross-sectional views of a molded substrate during different stages of a method of packaging integrated circuits using the molded substrate.

FIGS. 4A through 4C illustrate respective cross-sectional views of the molded substrate during formation of a metal redistribution layer.

FIGS. 5A and 5B illustrate respective cross-sectional views of the molded substrate during subsequent processing after formation of the metal redistribution layer according to an embodiment.

DETAILED DESCRIPTION

Figure 2:
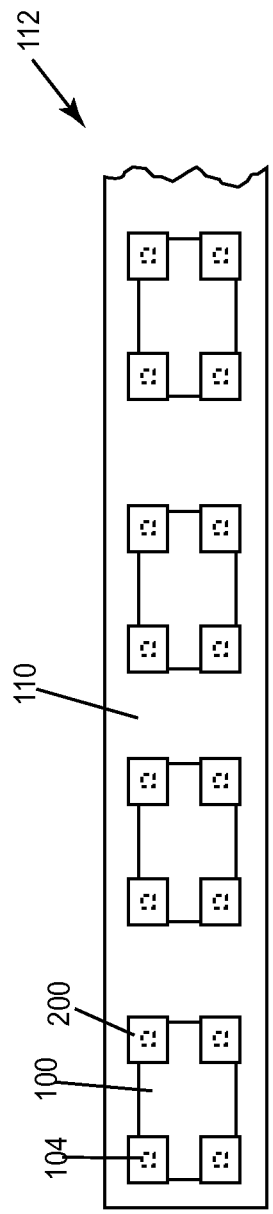
FIG. 2 illustrates a top-down plan view of the molded substrate according to an embodiment.

The embodiments described herein provide a molded eWLB substrate in which semiconductor dies are embedded in a molding compound to form a molded structure and a metal redistribution layer is formed on the molded structure in direct contact with the terminals of the semiconductor dies and the molding compound. As such, no solder stop or other dielectric layer is interposed between the molded structure of the eWLB substrate and the metal redistribution layer formed on the molded structure, reducing the cost of the eWLB substrate.

FIG. 1, which includes FIGS. 1A through 1D, illustrates cross-sectional views of a molded substrate during different stages of a method of packaging integrated circuits using the molded substrate, according to an embodiment. A plurality of similar dies are processed at the same time, and separated into individual molded packages upon completion of the molded substrate processing. FIG. 1A shows the structure after a plurality of semiconductor dies 100 are placed on a thick support (carrier) substrate 102. The support substrate 102 provides mechanical support to the semiconductor dies 100 during subsequent molding and metallization processes, and can comprise e.g. a metal or ceramic plate. The front side 101 of each die 100 faces the support substrate 102 and has a plurality of terminals 104. For example in the case of a transistor die, at least a source (or emitter) terminal and a gate terminal can be disposed at the front side 101 of the die 100. In the case of a diode die, the anode and cathode terminals can be disposed at the front side 101 of the die 100. The terminals 104 can be in the form of a bond pad or any other type of terminal structure conventionally provided with semiconductor dies. The semiconductor dies 100 can have a dielectric layer 106 at the side 101 of the semiconductor dies 100 with the terminals 104. For example, the dielectric layer 106 can be a passivation layer such as $SiO_2$, $Si_3N_4$, and/or Imide and/or any other standard dielectric layer. At least part of the terminals 104 are uncovered by the dielectric layer 106. The dielectric layer 106 is optional, and can be omitted if desired. In either case, the semiconductor dies 100 are spaced apart from one another on the support substrate 102. An adhesive film 108 can be used to hold the semiconductor dies 100 in place on the support substrate 102.

FIG. 1B shows the structure after the semiconductor dies 100 are embedded in a molding compound 110 to form a molded structure 112. Any standard molding compound can be used such as the kind employed in conventional eWLB technology. For example, liquid or solid molding compounds can be used. In each case, the semiconductor dies 100 are covered by the molding compound 110 on all sides except the side 101 facing the support substrate 102 to form the molded structure 112.

FIG. 1C shows the structure after the support substrate 102 and adhesive film 108 are removed from the molded structure 112 to expose the side 101 of the semiconductor dies 100 with the terminals 104. The support substrate 102 and adhesive film 108 can be removed by mechanical and/or chemical etching.

FIG. 1D shows the structure after a metal redistribution layer 114 is formed on the molded structure 112. The metal redistribution layer 114 is formed without first forming a dielectric layer on the side 113 of the molded structure 112 with the terminals 104 of the semiconductor dies 100. As such, no solder stop or other dielectric layer is interposed between the molded structure 112 of the eWLB substrate and the metal redistribution layer 114 formed on the molded structure 112. Instead, the metal redistribution layer 114 is in direct contact with the terminals 104 of the semiconductor dies 100 and the molding compound 110, simplifying the manufacturing process and reducing the cost of the eWLB substrate. In the case of the semiconductor dies 100 each having a dielectric layer 106 at the side 101 of the semiconductor dies 100 with the terminals 104, the metal redistribution layer 114 is in direct contact with the dielectric layer 106 of the semiconductor dies 100 in addition to the die terminals 104 and the molding compound 110. Otherwise, the metal redistribution layer 114 is in direct contact with the semiconductor body of the dies 100 in addition to the terminals 104 and the molding compound 110.

In general, the metal redistribution layer 114 is designed to facilitate external electrical connections to the semiconductor dies 100 and is patterned accordingly. In one embodiment, the metal redistribution layer 114 is a structured copper layer formed e.g. by standard photolithography and Cu electroplating on the side 113 of the molded structure 112 with the terminals 104 of the semiconductor dies 100. The side of the metal redistribution layer 114 facing away from the molded structure 112 can have NiPPd, NiPPdAu or any other bondable or solderable surface.

FIG. 2 illustrates a top-down plan view of the molded structure 112 after the metal redistribution layer 114 is formed on the molded structure 112 and prior to singulation or separation into individual packages. According to this embodiment, the metal redistribution layer 114 is designed to enlarge the effective contact area for the terminals 104 of the semiconductor dies 100. More particularly, the metal redistribution layer 114 comprises pad structures 200 which are in direct contact with the terminals 104 of the semiconductor dies 100 and the molding compound 110. The pad structures 200 have a larger surface area than the terminals 104 of the semiconductor dies 100. The die terminals 104 are disposed under the pad structures 200, and are represented by dashed boxes in FIG. 2 to illustrate the surface area difference explained above. The larger pad structures 200 provide a greater surface area for contacting the individual packages after singulation (separation).

Figure 3:
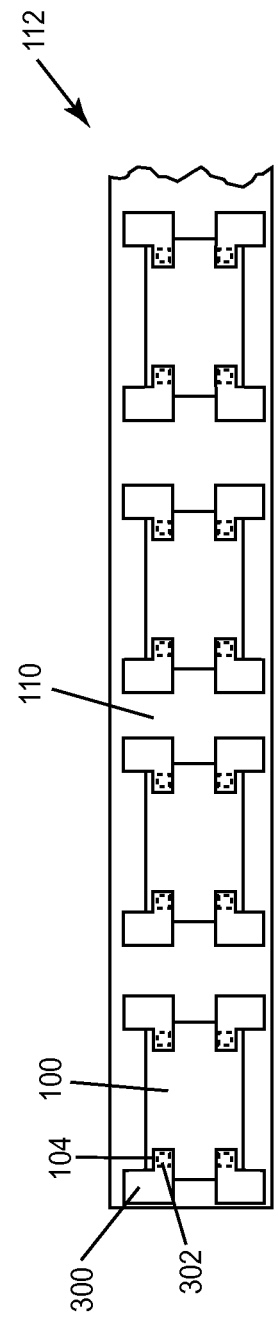
FIG. 3 illustrates a top-down plan view of the molded substrate according to another embodiment.

FIG. 3 illustrates a top-down plan view of the molded structure 112 after the metal redistribution layer 114 is formed on the molded structure 112 and prior to singulation or separation into individual packages, according to another embodiment. The metal redistribution layer 114 is designed to re-route electrical connections to the terminals 104 of the semiconductor dies 100 and also enlarge the effective contact area for the die terminals 104 according to this embodiment. More particularly, the metal redistribution layer 114 comprises pad structures 300 in direct contact with at least the molding compound 110. The pad structures 300 have a larger surface area than the terminals 104 of the semiconductor dies 100, and may extend onto the dies 100 depending on the layout. The metal redistribution layer 114 also comprises re-routing structures 302 according to this embodiment. The re-routing structures 302 are integrally formed with the pad structures 300 for re-distributing the pad structures 300 away from the terminals 104 of the semiconductor dies 100. The die terminals 104 are disposed under the re-routing structures 302, and represented by dashed boxes in FIG. 3 to illustrate the surface area difference explained above. The pad structures 300 and the re-routing structures 302 of the metal redistribution layer 114 are disposed in the same plane.

FIG. 4, which includes FIGS. 4A through 4C, illustrates cross-sectional views of the molded substrate during different stages of forming the metal distribution layer 114. According to this embodiment, the metal distribution layer 114 comprises copper. A mask is formed on the molded structure 112 so that the side 113 of the molded structure 112 with the terminals 104 of the semiconductor dies 100 has an unmasked region over at least the terminals 104 of the semiconductor dies 100 and part of the molding compound 110 and a masked region adjacent the unmasked region. In one embodiment, the mask formation process includes coating the side 113 of the molded structure 112 with the terminals 104 of the semiconductor dies 100 with a photoresist 400 and exposing regions of the photoresist 400 through a mask 402 with openings 404 as shown in FIG. 4A. The exposing process is represented by downward facing arrows in FIG. 4A. The photoresist 400 is then cured, and the undeveloped regions of the photoresist are removed to form a mask 406 as shown in FIG. 4B. The removed (undeveloped) regions of the photoresist 400 correspond to the regions where the copper redistribution layer 114 is to be formed. Copper is then electroplated on the unmasked region of the molded structure 112 to form the metal redistribution layer 114 which directly contacts the die terminals 104 and the molding compound 110 as shown in FIG. 4C. No intervening dielectric layer is interposed between the molded structure 112 and the electroplated metal redistribution layer 114.

FIG. 5, which includes FIGS. 5A and 5B, illustrates cross-sectional views of the molded substrate during subsequent processing after formation of the metal distribution layer 114 on the molded structure 112. According to this embodiment, solder 500 is formed on the metal redistribution layer 114 without first forming a solder mask on the side 113 of the molded structure 112 with the terminals 104 of the semiconductor dies 100 as shown in FIG. 5A. The solder 500 can be in the form of bumps or balls. The solder 500 can be formed by applying flux or other solderable material on the metal redistribution layer 114, placing the solder 500 on the flux material and reflowing the solder 500. The solder 500 can be printed e.g. in the form of solder paste. The side of the metal redistribution layer 114 facing away from the molded structure 112 can have NiPPd, NiPPdAu or any other solderable surface. The molded structure 112 is divided into individual semiconductor packages 502 after forming the solder 500 on the metal redistribution layer 114 as shown in FIG. 5B. Each one of the individual semiconductor packages 502 includes at least one semiconductor die 100.

Figure 6A:
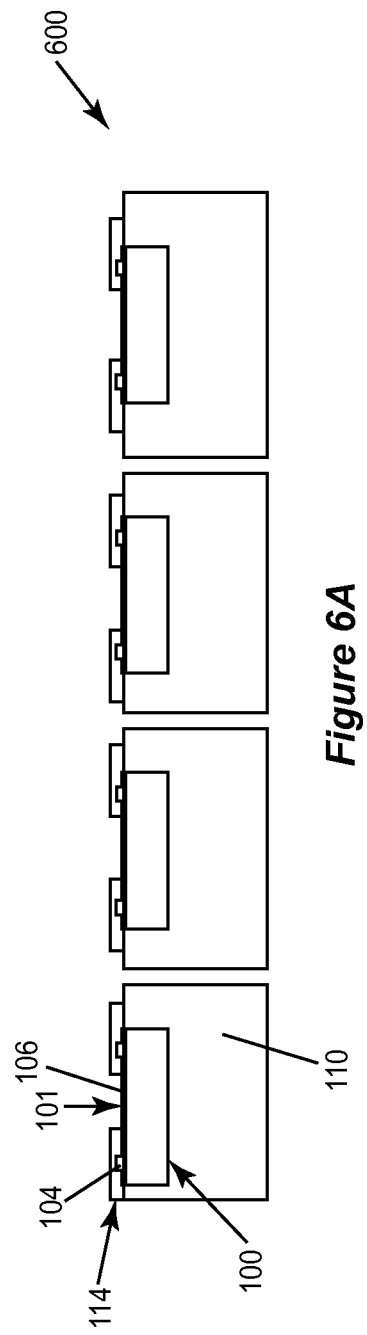
FIGS. 6A and 6B illustrate respective cross-sectional views of the molded substrate during subsequent processing after formation of the metal redistribution layer according to another embodiment.
Figure 6B:
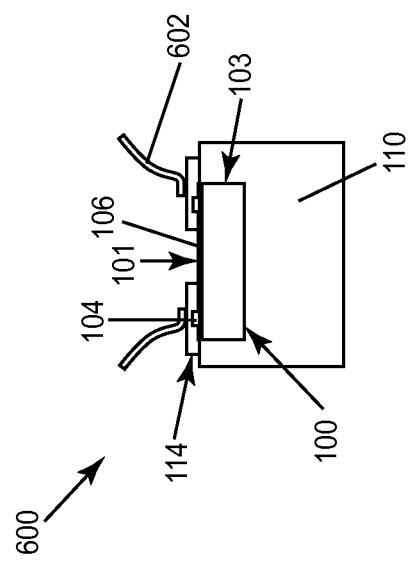

FIG. 6, which includes FIGS. 6A and 6B, illustrates cross-sectional views of the molded substrate during subsequent processing after formation of the metal distribution layer 114, according to another embodiment. In FIG. 6A, the molded structure 112 has been divided into individual semiconductor packages 600 without forming solder on the metal redistribution layer 114. Each one of the individual semiconductor packages 600 includes at least one semiconductor die 100. Bonding wires 602 are then attached to the metal redistribution layer 114 of each one of the individual semiconductor packages 600 as shown in FIG. 6B. FIG. 6B shows only one of the individual semiconductor packages 600 with bonding wires 602 for ease of illustration. The bonding wires 602 can be attached to the metal redistribution layer 114 of each individual semiconductor package 600 using any standard wire bonding process. The side of the metal redistribution layer 114 facing away from the molded structure 112 can have NiPPd, NiPPdAu or any other bondable surface.

As seen in FIG. 6B, the metal redistribution layer 114 is in direct contact with the terminals 104 of the semiconductor die 100 and extends beyond the lateral edge 103 of the semiconductor die 100 onto the molding compound 110. This way, the metal redistribution layer 114 directly contacts the molding compound 110 as previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A molded substrate, comprising:
a molded structure comprising a plurality of semiconductor dies embedded in a molding compound, each one of the semiconductor dies having a plurality of terminals at a side uncovered by the molding compound, the molding compound contacting edge faces of each semiconductor die, the edge faces extending perpendicular to the side uncovered by the molding compound; and
a metal redistribution layer on the molded structure and in direct contact with the terminals of the semiconductor dies and the same molding compound that contacts the edge faces of each semiconductor die, wherein the metal redistribution layer comprises pad structures in direct contact with the terminals of the semiconductor dies and the same molding compound that contacts the edge faces of each semiconductor die, the pad structures having a larger surface area than the terminals of the semiconductor dies.

2. The molded substrate of claim 1, wherein the metal redistribution layer further comprises:
re-routing structures integrally formed with the pad structures for re-distributing the pad structures away from the terminals of the semiconductor dies, the pad structures and the re-routing structures being disposed in the same plane.

3. The molded substrate of claim 1, wherein the semiconductor dies each have a dielectric layer at the side of the semiconductor dies with the terminals, at least part of the terminals being uncovered by the dielectric layer, and wherein the metal redistribution layer is in direct contact with the dielectric layer of the semiconductor dies.

4. The molded substrate of claim 1, further comprising solder on the metal redistribution layer.

5. The molded substrate of claim 1, wherein the metal redistribution layer comprises plated copper.

6. A molded semiconductor package, comprising:
a semiconductor die embedded in a molding compound, the semiconductor die having a plurality of terminals at a side uncovered by the molding compound, the molding compound contacting edge faces of the semiconductor die, the edge faces extending perpendicular to the side uncovered by the molding compound; and
a metal redistribution layer in direct contact with the terminals of the semiconductor die and extending beyond a lateral edge of the semiconductor die onto the molding compound, the metal redistribution layer directly contacting the same molding compound that contacts the edge faces of the semiconductor die, wherein the metal redistribution layer comprises pad structures in direct contact with the terminals of the semiconductor die and the same molding compound that contacts the edge faces of the semiconductor die, the pad structures having a larger surface area than the terminals of the semiconductor die.

7. The molded semiconductor package of claim 6, wherein the metal redistribution layer further comprises:
re-routing structures integrally formed with the pad structures for re-distributing the pad structures away from the terminals of the semiconductor die, the pad structures and the re-routing structures being disposed in the same plane.

8. The molded semiconductor package of claim 6, wherein the semiconductor die has a dielectric layer at the side of the semiconductor die with the terminals, at least part of the terminals being uncovered by the dielectric layer, and wherein the metal redistribution layer is in direct contact with the dielectric layer of the semiconductor die.

9. The molded semiconductor package of claim 6, further comprising solder on the metal redistribution layer.

10. The molded semiconductor package of claim 6, further comprising bonding wires connected to the metal redistribution layer.

* * * * *